US011159133B2

(12) United States Patent
Zanchi

(10) Patent No.: US 11,159,133 B2
(45) Date of Patent: Oct. 26, 2021

(54) BUFFER CIRCUIT FOR RADIO FREQUENCY SIGNALS

(71) Applicant: THE BOEING COMPANY, Chicago, IL (US)

(72) Inventor: Alfio Zanchi, Huntington Beach, CA (US)

(73) Assignee: THE BOEING COMPANY, Chicago, IL (US)

(*) Notice: Subject to any disclaimer, the term of this patent is extended or adjusted under 35 U.S.C. 154(b) by 0 days.

(21) Appl. No.: 16/717,571

(22) Filed: Dec. 17, 2019

(65) Prior Publication Data

US 2021/0184637 A1 Jun. 17, 2021

(51) Int. Cl.
*H03M 1/00* (2006.01)
*H03F 3/193* (2006.01)
*H03F 1/22* (2006.01)
*H03M 1/18* (2006.01)

(52) U.S. Cl.
CPC ............ *H03F 3/193* (2013.01); *H03F 1/223* (2013.01); *H03M 1/183* (2013.01); *H03F 2200/144* (2013.01); *H03F 2200/451* (2013.01)

(58) Field of Classification Search
CPC ...... H03M 3/468; H03M 3/422; H03M 3/436; H03M 1/00; H03M 3/454; H03M 3/324; H03M 1/08; H03M 1/70; H03M 1/0863; H03F 2200/451; H03F 3/195; H03F 3/193; H03F 2200/294; H03F 3/245; H03F 1/223; H03F 2200/387; H03F 1/56; H03F 2200/18; H03F 2200/222; H03F 1/0205; H03F 2200/129

USPC ......................... 341/122, 136, 139, 140, 155
See application file for complete search history.

(56) References Cited

U.S. PATENT DOCUMENTS

| 5,410,269 A * | 4/1995 | Ohie | ..................... G11C 27/026 327/391 |
| 5,760,649 A * | 6/1998 | Michail | ................. H03F 1/3217 330/264 |
| 7,061,279 B1 * | 6/2006 | Leete | ..................... H03L 7/0891 327/65 |

(Continued)

OTHER PUBLICATIONS

Im, D. et al., "A wideband CMOS low noise amplifier employing noise and IM2 distortion cancellation for a digital TV tuner," IEEE Journal of Solid-State Circuits 44 (2009): 686-698.

(Continued)

*Primary Examiner* — Linh V Nguyen
(74) *Attorney, Agent, or Firm* — Armstrong Teasdale LLP

(57) ABSTRACT

A buffer circuit for a radio frequency (RF) signal includes a single leg and a feedback mesh. The single leg is coupled between a voltage supply and ground. The single leg includes a pMOS FET and an nMOS FET, and an output terminal defined at drain terminals of the pMOS FET and the nMOS FET. The buffer circuit includes an input terminal capacitively coupled to gates of the pMOS FET and the nMOS FET. The input terminal is configured to receive the RF signal, and a buffered signal is provided on the output terminal. The feedback mesh is coupled to the output terminal and coupled to the gates of the pMOS FET and the nMOS FET. The feedback mesh includes a series-coupled inductive-resistive feedback impedance, and a resistive feedback impedance in parallel with the series-coupled inductive-resistive feedback impedance.

20 Claims, 4 Drawing Sheets

(56) References Cited

U.S. PATENT DOCUMENTS

| | | | | |
|---|---|---|---|---|
| 2001/0008383 | A1* | 7/2001 | Nishida | H03H 11/1213 330/294 |
| 2003/0214357 | A1* | 11/2003 | Cho | H03G 1/007 330/282 |
| 2008/0117087 | A1* | 5/2008 | Van Veldhoven | H03M 3/394 341/139 |
| 2009/0021309 | A1* | 1/2009 | Zheng | H03K 5/07 330/306 |
| 2009/0153132 | A1* | 6/2009 | Tufillaro | H03F 1/3241 324/76.21 |
| 2011/0291751 | A1* | 12/2011 | Park | H03H 7/0115 327/557 |
| 2015/0048889 | A1* | 2/2015 | Lin | H03F 1/223 330/291 |
| 2015/0091650 | A1* | 4/2015 | Nobbe | H03F 1/3205 330/291 |
| 2016/0011711 | A1* | 1/2016 | Hwang | G06F 3/04182 345/174 |
| 2016/0268713 | A1* | 9/2016 | Norton | G06F 13/4068 |
| 2016/0278713 | A1* | 9/2016 | Shoaran | A61B 5/7232 |
| 2019/0280654 | A1* | 9/2019 | Darwish | H03G 3/3036 |

OTHER PUBLICATIONS

Kull, L. et al., "Implementation of low-power 6-8 b 30-90 GS/s time-interleaved ADCs with optimized input bandwidth in 32 nm Cmos," IEEE Journal of Solid-State Circuits 51.3 (2016): 636-648.

Stepanovic, D. et al., "A 2.8 GS/s 44.6 mW time-interleaved ADC achieving 50.9 dB SNDR and 3 dB effective resolution bandwidth of 1.5 GHz in 65 nm CMOS." IEEE Journal of Solid-State Circuits 48, No. 4 (2013): 971-982.

Zhang, H. et al., "A low-power, linearized, ultra-wideband LNA design technique," IEEE Journal of solid-state circuits 44, No. 2 (2009): 320-330.

Lin, Y., et al., "3-10-GHz ultra-wideband low-noise amplifier utilizing miller effect and inductive shunt-shunt feedback technique," IEEE Transactions on Microwave Theory and Techniques 55, No. 9 (2007): 1832-1843.

Ghasemi, O. et al. "A low power Transimpedance Amplifier using inductive feedback approach in 90nm CMOS," In 2009 IEEE International Symposium on Circuits and Systems, pp. 1937-1940. IEEE, 2009.

Ghasemi, O., "Combination of inductive feedback and shunt peaking (IF+ SHP) for bandwidth extension of transimpedance amplifiers," In 2015 IEEE International Conference on Electronics, Circuits, and Systems (ICECS), pp. 145-148. IEEE, 2015.

Ghasemi, O., "Bandwidth Extension for Transimpedance Amplifiers," In Photodiodes-World Activities in 2011. IntechOpen, 2011.

Devarajan, S., et al., "A 12-b 10-GS/s Interleaved Pipeline ADC in 28-nm CMOS Technology," IEEE Journal of Solid-State Circuits 52, No. 12 (2017): 3204-3218.

Chalvatzis, T., et al. "Low-voltage topologies for 40-GB/s circuits in nanoscale CMOS," IEEE Journal of Solid-State Circuits 42, No. 7 (2007): 1564-1573.

Apfel, R., et al.,"A fast-settling monolithic operational amplifier using doublet compression techniques," IEEE Journal of Solid-State Circuits 9, No. 6 (1974): 332-340.

* cited by examiner

BUFFER CIRCUIT FOR RADIO FREQUENCY SIGNALS

FIELD

The field of the disclosure relates generally to buffer circuits for radio frequency (RF) signals, and more specifically to a buffer circuit for an analog-to-digital converter (ADC) and methods of analog-to-digital conversion.

BACKGROUND

Many RF systems use analog-to-digital conversion to process a received RF signal for input to one or more digital systems. Conventional RF systems use one or more buffer stages between the RF source, such as an antenna or fast wired channel, and the ADC device itself to mitigate the loading effects of the ADC on the RF source, which can affect fundamental impedance matching and signal integrity. For example, some ADC devices such as switched capacitor ADCs connect a single large capacitor to their analog input, immediately drawing charge from the previous stage, e.g., the buffer or antenna. In other examples, the ADC may include multiple ADC cores that iteratively connect to the analog input, effectively multiplying the loading on the previous stage. Conventional buffer circuits may include multiple buffer stages to achieve impedance matching and sufficient signal gain and input isolation, at the expense of introducing offset, gain, and delay disparity among samples. Additionally, in at least some applications, to achieve high speed and high resolution over a large bandwidth, multi-stage buffer circuits complicate provision of sufficient charge to the one or more ADC cores while maintaining low distortion and low attenuation. Moreover, many conventional buffer circuits introduce and amplify their own noise, further complicating such buffer designs.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect of the present disclosure is directed to a buffer circuit for an RF signal. The buffer circuit includes a single leg and a feedback mesh. The single leg is coupled between a voltage supply and ground. The single leg includes a pMOS FET and an nMOS FET, and an output terminal defined at drain terminals of the pMOS FET and the nMOS FET. The buffer circuit includes an input terminal capacitively coupled to gates of the pMOS FET and the nMOS FET. The input terminal is configured to receive the RF signal, and a buffered signal is provided on the output terminal. The feedback mesh is coupled to the output terminal and coupled to the gates of the pMOS FET and the nMOS FET. The feedback mesh includes a series-coupled inductive-resistive feedback impedance, and a resistive feedback impedance in parallel with the series-coupled inductive-resistive feedback impedance.

Another aspect is directed to an ADC circuit for sampling an RF signal. The ADC circuit includes an RF source, an ADC, and a buffer circuit. The RF source is configured to supply the RF signal, and the ADC is configured to sample the RF signal. The buffer circuit is coupled between the ADC and the RF source. The buffer circuit includes a single leg coupled between a voltage supply and ground. The single leg includes a pMOS FET and an nMOS FET. The buffer circuit includes an output terminal defined at drain terminals of the pMOS FET and the nMOS FET. The output terminal is coupled to the ADC and is configured to supply a buffered signal to the ADC. The buffer circuit includes an input terminal coupled to the RF source and capacitively coupled to gates of the pMOS FET and the nMOS FET. The buffer circuit includes a feedback mesh coupled to the output terminal and coupled to the gates of the pMOS FET and the nMOS FET. The feedback mesh includes a series-coupled inductive-resistive feedback impedance, and a resistive feedback impedance proximate to and in parallel with the series-coupled inductive-resistive feedback impedance.

Yet another aspect is directed to a method of analog-to-digital conversion for an RF signal. The method includes receiving the RF signal at an antenna. The method includes capacitively coupling the RF signal to gates of a buffer circuit coupled between a voltage supply and ground. The method includes amplifying the RF signal. The method includes applying a negative feedback to the buffer circuit to linearize a gain of the buffered circuit producing a buffered signal. The method includes supplying the buffered signal to the ADC. The method includes sampling of the buffered signal by the ADC.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated examples may be incorporated into any of the above-described aspects, alone or in any combination.

Figure 1:
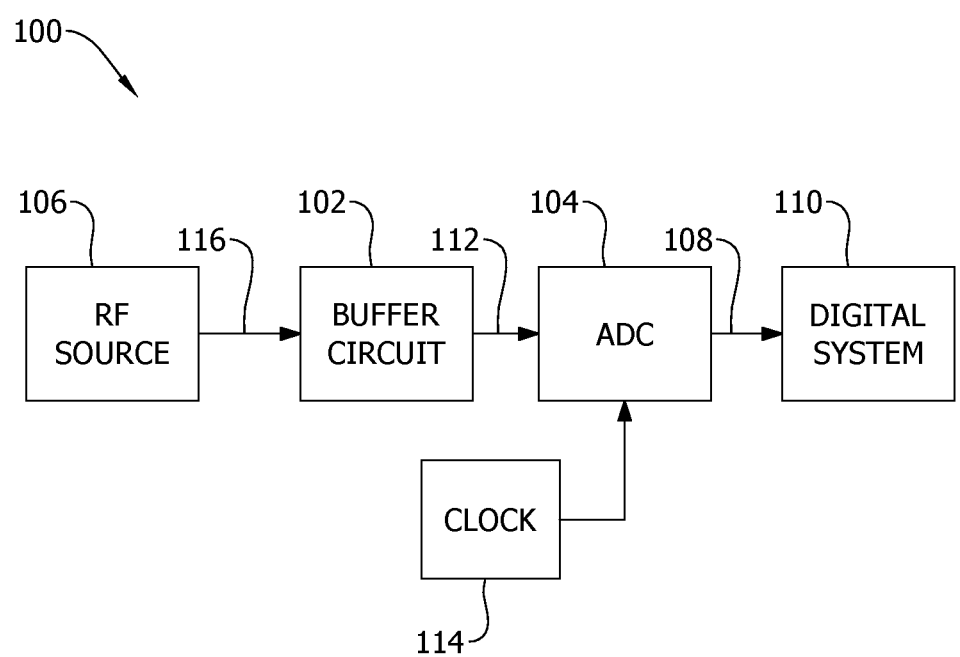
FIG. 1 is a block diagram of an ADC circuit.

Corresponding reference characters indicate corresponding parts throughout the several views of the drawings. Although specific features of various examples may be shown in some drawings and not in others, this is for convenience only. Any feature of any drawing may be referenced and/or claimed in combination with any feature of any other drawing.

DETAILED DESCRIPTION

Embodiments of the buffer circuits include a single-stage, single-leg buffer with symmetric n-type and p-type metal-oxide semiconductor (nMOS and pMOS) field-effect transistors (FETs) and a negative feedback mesh that yields a gain for the buffer circuit that is lower at low frequencies, higher at high frequencies, and rises linearly within the frequency span in between. The feedback mesh includes both a series-resistive feedback and a parallel-resistive feedback. The buffer circuits described herein enable a single-stage buffer for large capacitive loads, yielding a relatively flat wideband transfer function, low distortion, low noise, and a large-signal drive capacity. The buffer circuits described herein operate with a single voltage supply and ground, thereby eliminating the need for additional voltage supply circuitry that itself may introduce noise, consume additional power and physical space, and introduce limitations on current throughput when the voltage requires charge-pumping above nominal available rail voltages.

In certain embodiments, the buffer circuits include high spurious-free dynamic-range (SFDR) enabling more than 12-bit nominal resolution, with more than 10 bits of effective resolution (generally expressed as effective number of bits, or ENOB), and at least 60 decibels of distortion with respect to the carrier signal (generally expressed as dBc) at clocking rates of one giga-sample per second (GSps) or more.

At least some conventional buffer circuits utilize amplifiers with simple resistive feedback, theoretically resulting in a fixed gain over frequency, and therefore further resulting in unwanted attenuation when connected to capacitive loads at higher frequencies. Other conventional buffer circuits in purely digital applications introduce a series inductance in the feedback to boost a given buffer stage's gain at high frequencies. However, when such feedback is applied to an analog buffer circuit, it introduces distortion and results in a non-linear transfer function, particularly at high frequencies. Challenges of controlling non-linearities in gain (resulting in distortion) over a large bandwidth are conventionally addressed via piece-meal techniques utilizing multiple stages of buffers, again complicating the design and potentially compounding amplification and noise of the analog input signal.

FIG. 1 is a block diagram of an ADC circuit 100 including a buffer circuit 102. Buffer circuit 102 is connected at an input, or on the "front end," of an ADC 104, between ADC 104 and an RF source 106. Buffer circuit 102 is directly coupled to RF source 106 and directly coupled to ADC 104, thus making buffer circuit 102 a single-stage buffer. In alternative embodiments, buffer circuit 102 may be duplicated, or otherwise a plurality of buffer circuits used, for multiple stages between RF source 106 and ADC 104. However, even in time-interleaved multi-core ADCs, a single-stage buffer has the benefit of simpler design, less power consumption, elimination of compounding gain and noise, and fewer contributions of offset, gain, and delay disparities that may appear in the digital samples at an output of ADC 104.

ADC 104 produces a digital signal 108 for use by a digital system 110, such as a digital signal processor, microcontroller, or other processing device. ADC 104 generally includes one or more ADC cores that iteratively capture samples of an RF signal or, more specifically, a buffered signal 112, according to a clock 114. Clock 114 should generally be fast enough to achieve a sufficient sampling rate to maintain data integrity (e.g., avoiding "aliasing") in the digital output of ADC 104, i.e., digital signal 108; yet should be slow enough to maximize performance of ADC circuit 100. The sampling rate is therefore generally determined according to the Nyquist theorem as applied for ADC circuit 100, and according to the physical design of ADC circuit 100 itself.

RF source 106 may include, for example, an antenna or a fast wired channel on which an RF signal 116 is received. RF source 106 may be at a fixed installation or on a vehicle such as an aircraft, a space vehicle, a ship, or a land vehicle. RF source 106 supplies the RF signal 116 to buffer circuit 102, and the buffered signal 112 is sampled by ADC 104 to produce digital signal 108 for digital system 110.

Figure 2:
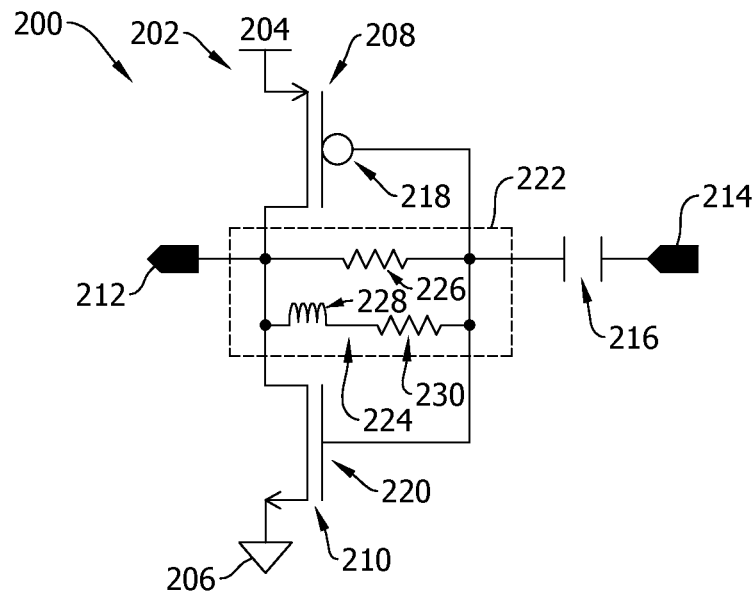
FIG. 2 is a schematic diagram of an example buffer circuit for use in the ADC circuit of FIG. 1.

FIG. 2 is a schematic diagram of an example buffer circuit 200 for use in ADC circuit 100 of FIG. 1. Buffer circuit 200 includes a single leg 202 coupled, or electrically connected, between a voltage supply 204 and ground 206. Single leg 202 includes one or more pMOS FET and one or more nMOS FET. The embodiment of buffer circuit 200 shown in FIG. 2 includes a single pMOS FET 208 and a single nMOS FET 210 coupled together at their respective drain terminals to define an output terminal 212. In alternative embodiments, multiple pMOS FETs 208 may be stacked between output terminal 212 and voltage supply 204, and multiple nMOS FETs 210 may be stacked between output terminal 212 and ground 206. The number of pMOS FET devices and nMOS FET devices is preferably equal, resulting in symmetry of the active components that effectively negate each other's distortion contribution to the buffered signal produced on output terminal 212. Additionally, buffer circuit 200 having only a single leg 202 results in reduced power consumption, as a same current flows through both pMOS FET 208 and nMOS FET 210 (sometimes referred to as "current reuse").

Figure 3:
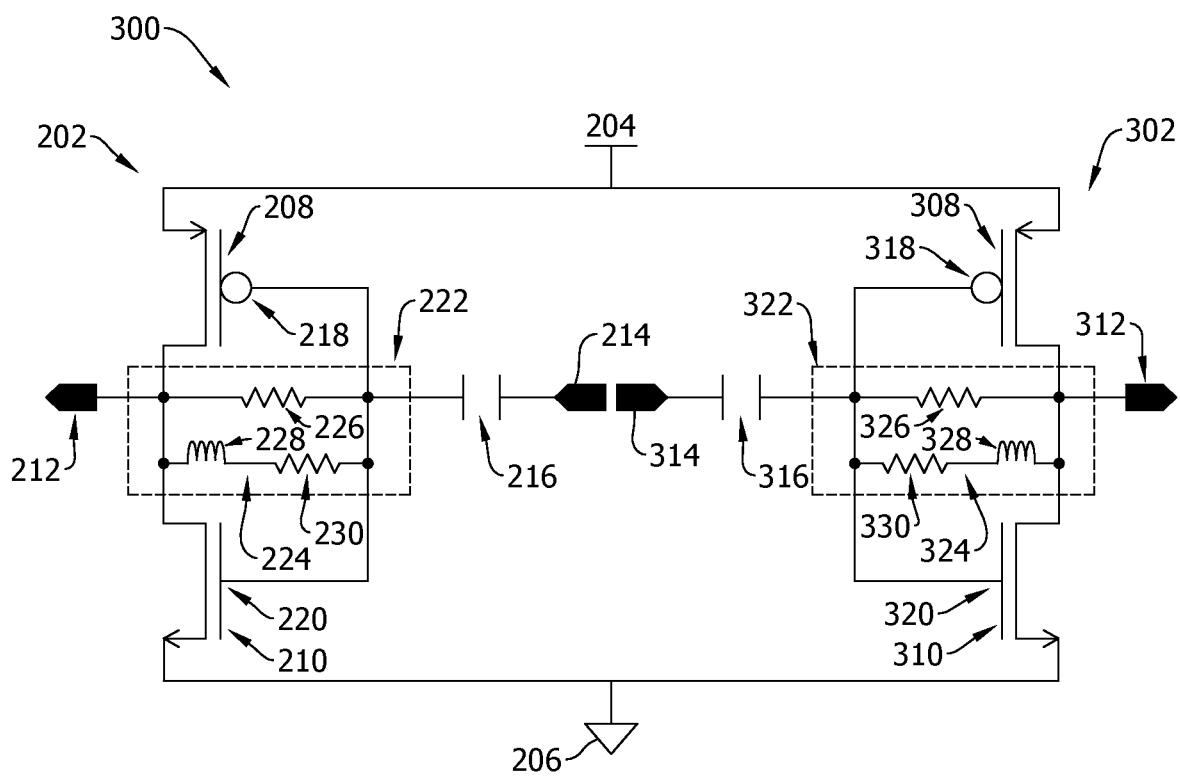
FIG. 3 is a schematic diagram of another example buffer circuit for use in the ADC circuit of FIG. 1.

FIG. 3 is a schematic diagram of another example buffer circuit 300 for use in ADC circuit 100 of FIG. 1. Buffer circuit 300 is a differential implementation of buffer circuit 200 shown in FIG. 2. Accordingly, buffer circuit 300 includes the same components and operates in the same manner as buffer circuit 200, but with a second leg 302 coupled between voltage supply 204 and ground 206 in addition to first leg 202. The embodiment of FIG. 3 widens the input signal range, for example, to 1 V differential peak-to-peak with 1 V voltage supply, and benefits from the advantages of differential signal handling, including, for example, wider signal range, larger signal-to-noise ratio, voltage supply interference rejections, and common-mode noise rejection.

Referring to FIG. 2, buffer circuit 200 includes an input terminal 214 configured to receive an RF signal from an RF source. For example, in ADC circuit 100 shown in FIG. 1, input terminal 214 receives RF signal 116 directly from RF source 106. Likewise, buffer circuit 200 produces buffered signal 112 at output terminal 212, which is supplied to ADC 104. Input terminal 214 is capacitively coupled, i.e., coupled through a capacitor 216, to a gate 218 of pMOS FET 208 and to a gate 220 of nMOS FET 210.

Figure 4:
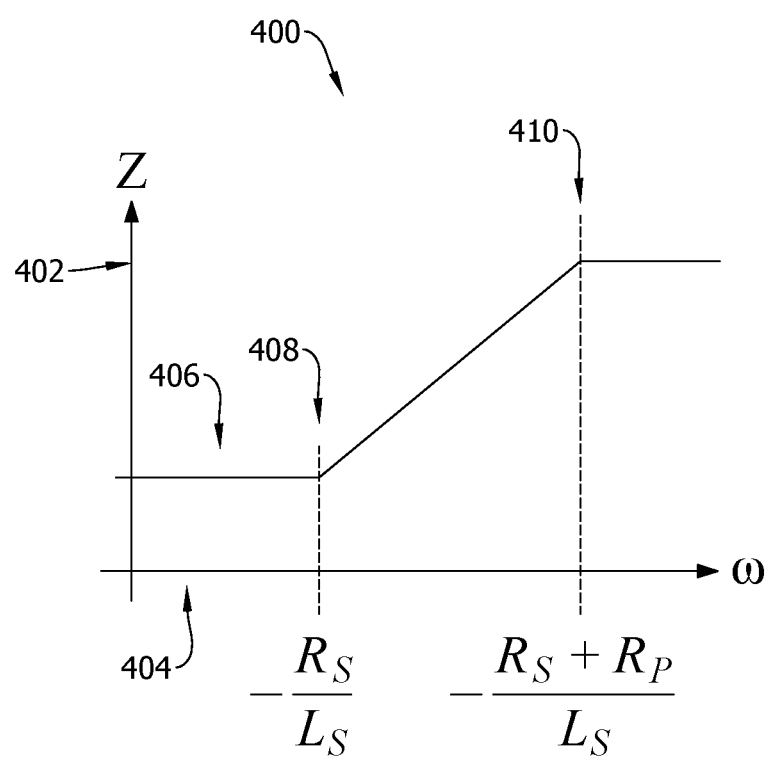
FIG. 4 is a graph of an example impedance profile for the buffer circuits shown in FIGS. 2 and 3.

Buffer circuit 200 includes a feedback mesh 222 coupled to output terminal 212 and coupled to gates 218 and 220 of pMOS FET 208 and nMOS FET 210, respectively. Feedback mesh 222 includes a series-coupled inductive-resistive feedback impedance 224 and a resistive feedback impedance 226 in parallel with series-coupled inductive-resistive feedback impedance 224. The series-coupled inductive-resistive feedback impedance 224 includes an inductance 228 coupled in series with a resistance 230. In certain embodiments, resistive feedback impedance 226 is located proximate series-coupled inductive-resistive feedback impedance 224. By minimizing the impact of doping or planarity gradients in the integrated circuit manufacturing technology in use, such proximate location enables each branch's performance to track more reliably across temperature and process corners, because the resistors are approximately affected by the same factors. The negative feedback provided by feedback mesh 222 controls gain of buffer circuit 200, which is configured to increase linearly with the frequency of the RF signal received at input terminal 214 over at least a portion of an operating bandwidth of buffer circuit 200. FIG. 4 is a graph illustrating an impedance profile 400 of feedback mesh 222. Impedance (Z) is expressed on a vertical axis 402 versus angular frequency (w) expressed on a horizontal axis 404. More specifically, at lower frequencies 406 (those below the angular frequency, expressed as $$-R_S/L_S,$$

(where the symbolic terms correspond to the values of resistance 230 ($R_S$) and inductance 228 ($L_S$)) of a zero 408 defined by the series-coupled inductive-resistive feedback impedance 224) the impedance of inductance 228 tends toward zero (i.e., the device functions as a short circuit), resulting in feedback mesh 222 taking the predominant form of two parallel resistors: resistive feedback impedance 226 and resistance 230. This relatively low impedance at low frequencies 406 holds the gain of buffer circuit 200 low. Conversely, as frequency increases, the impedance of inductance 228 increases and eventually it functions as an open circuit, resulting in resistance 226 being the sole impedance in the negative feedback of feedback mesh 222. Accordingly, the gain of the buffer circuit increases toward higher frequencies (those above zero 408 and up to an angular frequency, expressed as $$-R_S+R_P/L_S,$$

(where the symbolic terms correspond to the value of resistance 226 ($R_P$), resistance 230 ($R_S$), and inductance 228 ($L_S$)) of a pole 410 defined by the topological connection of resistance 226 in with series-coupled inductive-resistive impedance 224), and feedback mesh 222 yields a linear gain increase as its impedance grows with frequency from zero 408 (where inductance 228 can still be effectively considered a short circuit) to pole 410 (where inductance 228 can be effectively considered an open circuit).

In certain embodiments, buffer circuit 200 can be designed to operate with a spurious-free dynamic range (SFDR) of greater than 60 dBc, even with input signals of about 0.5 V single-ended peak-to-peak coupled to input electrode 214, and a supply voltage of about 1.0 V coupled to voltage supply 204. Factors that contribute to low distortion characteristics of buffer circuit 200 include, for example: the relative sizing of nMOS FET 210 and pMOS FET 208, the absolute width of their conductive channels, and the extent of the linearizing negative feedback imparted by feedback mesh 222. Smaller signals coupled to input terminal 214 display even higher degrees of SFDR performance.

In certain embodiments, buffer circuit 200 attenuates the received RF signal by no more than 3 dB over its bandwidth. In certain embodiments, buffer circuit 200 attenuates the received RF signal by no more than 1 dB over its bandwidth. Factors that contribute to compounded low attenuation characteristics of buffer circuit 200 include, for example: the sizing of nMOS FET 210 and pMOS FET 208 devices (e.g., input matching properties and potential signal attenuation at the source), countered by the gain of the buffer stage as controlled by transconductances of nMOS FET 210 and pMOS FET 208, and particularly the negative feedback imparted by the feedback mesh 222 and loaded by the ADC capacitive input that eventually increases the attenuation for RF input frequencies. The low attenuation characteristics of buffer circuit 200 make it well-suited for feeding broadband signals into, for example, ADC 104.

Buffer circuit 200 is operable, for example, for bandwidths exceeding 5 GHz. The operating bandwidth of the circuit is determined by its attenuation profile, as explained above, which can be extended to very high frequencies even for large signals, and even when facing large capacitive loads such as those present in a whole time-interleaved switched-capacitor ADC.

Referring to buffer circuit 300 of FIG. 3, second leg 302 includes one or more pMOS FET and one or more nMOS FET. The embodiment of buffer circuit 300 shown in FIG. 3 includes a single pMOS FET 308 and a single nMOS FET 310 coupled together at their respective drain terminals to define an output terminal 312. In alternative embodiments, multiple pMOS FETs 308 may be stacked between output terminal 312 and voltage supply 204, and multiple nMOS FETs 310 may be stacked between output terminal 312 and ground 206. The number of pMOS FET devices and nMOS FET devices in second leg 302 is preferably equal, and is furthermore equal to the numbers of pMOS FETs 208 and nMOS FETs 210 in first leg 202. Again, the resulting symmetry of active components effectively negates each other's noise and distortion contribution to the buffered signal.

Buffer circuit 300 includes an input terminal 314 configured to receive an RF signal from an RF source. For example, in ADC circuit 100 shown in FIG. 1, input terminal 314 receives RF signal 116 directly from RF source 106. Likewise, buffer circuit 300 produces buffered signal 112 as a combination of a buffered signal at output terminal 312 and a buffered signal at output terminal 212. In the embodiment of FIG. 3, first leg 202 functions as a negative leg, and second leg 302 functions as a positive leg. Accordingly, the RF signal supplied to input terminal 214 is a differential inverse of the RF signal supplied to input terminal 314. Likewise, the buffered signal produced at output terminal 212 is roughly the inverse of the buffered signal produced at output terminal 312. Any discrepancies between the positive and the inverse of the negative buffered signals is a result of distortion or noise within buffer circuit 300.

Input terminal 314 is capacitively coupled, i.e., coupled through a capacitor 316, to a gate 318 of pMOS FET 308 and to a gate 320 of nMOS FET 310. Buffer circuit 300 includes a feedback mesh 322 coupled to output terminal 312 and coupled to gates 318 and 320 of pMOS FET 308 and nMOS FET 310, respectively. Feedback mesh 322, like feedback mesh 222, includes a series-coupled inductive-resistive feedback impedance 324 and a resistive feedback impedance 326 in parallel with series-coupled inductive-resistive feedback impedance 324. The series-coupled inductive-resistive feedback impedance 324 includes an inductance 328 coupled in series with a resistance 330. In certain embodiments, resistive feedback impedance 326 is located proximate series-coupled inductive-resistive feedback impedance 324. By minimizing the impact of doping or planarity gradients in the integrated circuit manufacturing technology in use, the proximate location enables each branch's performance to track more reliably across temperature and process corners, because the resistors are approximately affected by the same factors. The negative feedback provided by feedback mesh 322 controls the gain of buffer circuit 300, which is configured to increase linearly with the frequency of the RF signal received at input terminal 314 over at least a portion of an operating bandwidth of buffer circuit 300. More specifically, at lower frequencies, e.g., below zero 408 shown in FIG. 4 and corresponding to the zero defined by resistance 330 and inductance 328, the impedance of inductance 328 tends toward zero (i.e., the device functions as a short circuit), resulting in feedback mesh 322 taking the predominant form of two parallel resistors: resistive feedback impedance 326 and resistance 330. This relatively low impedance at low frequencies 406 holds the gain of buffer circuit 300 low.

Conversely, as frequency increases above zero 408, the impedance of inductance 328 increases and eventually it functions as an open circuit, resulting in resistance 326 as the sole impedance in the negative feedback of feedback mesh 322. Accordingly, gain increases at higher frequencies up to pole 410 shown in FIG. 4, and corresponding to the pole defined by the topological connection of resistance 326 with series-coupled resistive-inductive impedance 324, because feedback mesh 322 yields a linear gain increase as its impedance grows with frequency from zero 408 (where inductance 328 can still be effectively considered a short circuit) to pole 410 (where inductance 328 can be effectively an open circuit).

Figure 5:
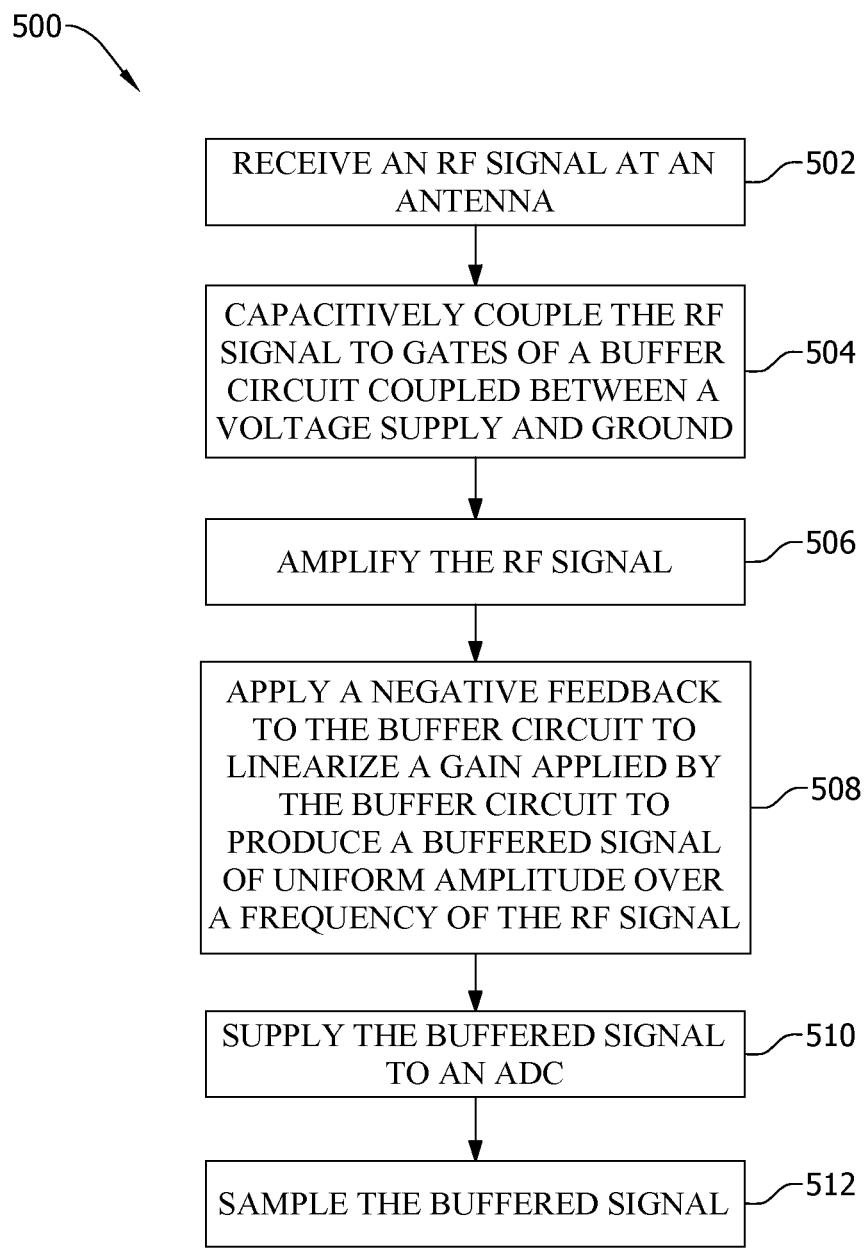
FIG. 5 is a flow diagram of a method of analog-to-digital conversion.

FIG. 5 is a flow diagram of a method 500 of analog-to-digital conversion for an RF signal, such as RF signal 116 received by ADC circuit 100 shown in FIG. 1. Referring to FIGS. 1, 2, and 4, RF signal 116 is received 502 at RF source 106, such as an antenna. RF signal 116 is capacitively coupled 504 to gates 218 and 220 of buffer circuit 200 coupled between voltage supply 204 and ground 206. Single leg 202 amplifies 506 RF signal 116. In the embodiment of buffer circuit 200 shown in FIG. 2, amplifying includes supplying RF signal 116 to gates 218 and 220 of pMOS FET 208 and nMOS FET 210, respectively, which are coupled in series in single leg 202, and having their respective drain terminals coupled at a common node to define output terminal 212.

Feedback mesh 222 applies 508 a negative feedback to buffer circuit 200 to linearize and stabilize a gain of the buffer circuit 200 to produce buffered signal 112. Because of the zero-pole singularity sequence provided by the arrangement of passive components constituting feedback mesh 222, the resulting gain of buffer circuit 200, accordingly, increases linearly with a frequency of RF signal 116 over at least a portion of a desired operating bandwidth of ADC 104. In at least some embodiments, the joint operating bandwidth of buffer circuit 200 coupled to ADC 104 (to yield ADC circuit 100) is at least 5 GHz.

Buffered signal 112 is supplied 510 to ADC 104, where it is sampled 512 for the purpose of generating digital signal 108 for use by digital system 110. Digital signal 108 can be produced by ADC circuit 100 with, for example, an SFDR of greater than 60 dBc over a bandwidth exceeding 5 GHz, because of the linearity and gain profile characteristics of buffer circuit 200 over frequency, which allows for signal 116 to be preserved (i.e., not attenuated, nor harmonically corrupted) even at high RF frequencies, before the digitization process occurs in ADC 104 using sampled values obtained by sampling 512.

An exemplary technical effect of the methods, systems, and apparatus described herein includes at least one of: (a) reducing buffer stages to a single-stage buffer between the RF source and ADC; (b) reducing distortion through use of a single-leg buffer with symmetric n-type and p-type MOS-FET devices; (c) producing a linear and uniform gain over a wide bandwidth through use of a linear feedback mesh with signal boosting capabilities; (d) providing large signal drive capability; and (e) reducing circuit complexity, noise or interference, and power consumption by use of only a single voltage supply and ground reference.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

As used herein, an element or step recited in the singular and preceded by the word "a" or "an" should be understood as not excluding plural elements or steps unless such exclusion is explicitly recited. Furthermore, references to "one embodiment" of the present invention or the "example embodiment" are not intended to be interpreted as excluding the existence of additional embodiments that also incorporate the recited features.

This written description uses examples to disclose various embodiments, which include the best mode, to enable persons skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A buffer circuit for a radio frequency (RF) signal, the buffer circuit comprising:
    a single leg coupled between a voltage supply and ground, wherein the single leg includes:
        a p-type metal-oxide semiconductor (pMOS) field-effect transistor (FET) and an n-type metal-oxide semiconductor (nMOS) FET;
        an output terminal defined at drain terminals of the pMOS FET and the nMOS FET, wherein the output terminal is configured to supply a buffered signal; and
        an input terminal capacitively coupled to gates of the pMOS FET and the nMOS FET and configured to receive the RF signal; and
    a feedback mesh coupled to the output terminal and coupled to the gates of the pMOS FET and the nMOS FET, wherein the feedback mesh includes:
        a series-coupled inductive-resistive feedback impedance; and
        a resistive feedback impedance in parallel with the series-coupled inductive-resistive feedback impedance.

2. The buffer circuit of claim 1, wherein the resistive feedback impedance is proximate to the series-coupled inductive-resistive feedback impedance.

3. The buffer circuit of claim 2, wherein a gain of the buffer circuit is configured to increase linearly with a frequency of the RF signal over at least a portion of an operating bandwidth of the buffer circuit.

4. The buffer circuit of claim 3, wherein the operating bandwidth is at least 5 GHz.

5. The buffer circuit of claim 3, wherein the resistive feedback impedance in parallel with a resistive portion of the series-coupled inductive-resistive feedback impedance is configured to yield a lower gain at low frequencies relative to higher gain at higher frequencies, thereby compensating for a decrease in impedance at the output terminal resulting from a capacitive load being coupled to the output terminal.

6. The buffer circuit of claim 1 further comprising a second leg comprising:
   a second input terminal configured to receive an inverse of the RF signal; and
   a second output terminal configured to provide an inverse of the buffered signal.

7. The buffer circuit of claim 1, wherein the single leg and the feedback mesh yield an attenuation of no more than 1 decibel (dB) across an operating bandwidth of the buffer circuit.

8. An analog-to-digital converter (ADC) circuit for sampling a radio frequency (RF) signal, the ADC circuit comprising:
   an RF source configured to supply the RF signal;
   an ADC configured to sample the RF signal; and
   a buffer circuit coupled between the ADC and the RF source, wherein the buffer circuit includes:
      a single leg coupled between a voltage supply and ground, wherein the single leg includes:
         a p-type metal-oxide semiconductor (pMOS) field-effect transistor (FET) and an n-type metal-oxide semiconductor (nMOS) FET;
         an output terminal defined at drain terminals of the pMOS FET and the nMOS FET, wherein the output terminal is coupled to the ADC and configured to supply a buffered signal thereto; and
         an input terminal coupled to the RF source and capacitively coupled to gates of the pMOS FET and the nMOS FET; and
      a feedback mesh coupled to the output terminal and coupled to the gates of the pMOS FET and the nMOS FET, wherein the feedback mesh includes:
         a series-coupled inductive-resistive feedback impedance; and
         a resistive feedback impedance in parallel with the series-coupled inductive-resistive feedback impedance.

9. The ADC circuit of claim 8, wherein the RF source comprises an aircraft antenna configured to receive the RF signal and supply the RF signal directly to the input terminal of the buffer circuit.

10. The ADC circuit of claim 8, wherein the resistive feedback impedance is proximate to the series-coupled inductive-resistive feedback impedance.

11. The ADC circuit of claim 8, wherein the buffer circuit comprises a single buffer stage coupled directly to the ADC and further coupled directly to the RF source.

12. The ADC circuit of claim 8, wherein a gain of the buffer circuit is configured to increase linearly with a frequency of the RF signal over at least a portion of an operating bandwidth of the buffer circuit.

13. The ADC circuit of claim 8, wherein a spurious-free dynamic range (SFDR) of the buffer circuit is greater than 60 decibels referred to a carrier signal (dBc).

14. The ADC circuit of claim 8, wherein attenuation of the RF signal is no more than 3 dB over a bandwidth of the ADC circuit.

15. A method of analog-to-digital conversion for a radio frequency (RF) signal, the method comprising:
   receiving the RF signal at an antenna;
   capacitively coupling the RF signal to gates of a buffer circuit coupled between a voltage supply and ground;
   amplifying the RF signal;
   applying a negative feedback to the buffer circuit to produce a gain applied by the buffer circuit that increases linearly with a frequency of the RF signal to produce a buffered signal of uniform amplitude over the frequency of the RF signal;
   supplying the buffered signal to an analog-to-digital converter (ADC); and
   sampling, by the ADC, the buffered signal to enable subsequent digitization wherein said applying the negative feedback comprises:
      applying a series-coupled inductive-resistive feedback impedance; and
      applying a resistive feedback impedance in parallel with the series-coupled inductive-resistive feedback impedance.

16. The method of claim 15, wherein said amplifying the RF signal comprises supplying the RF signal to corresponding gates of a p-type metal-oxide semiconductor (pMOS) field-effect transistor (FET) and an n-type metal-oxide semiconductor (nMOS) FET coupled in series in a single leg of the buffer circuit and defining an output terminal at a common node to which their corresponding drains are coupled.

17. The method of claim 15, wherein the gain of the buffer circuit increases linearly with a frequency of the RF signal over at least a portion of an operating bandwidth of the ADC.

18. The method of claim 17, wherein the operating bandwidth is at least 5 GHz.

19. The method of claim 15, wherein a spurious-free dynamic range (SFDR) of the buffered signal is greater than 60 decibels referred to a carrier signal (dBc).

20. The method of claim 15, wherein said capacitively coupling the RF signal to the gates of the buffer circuit further comprises capacitively coupling the RF signal directly to the gates of the buffer circuit; and wherein said supplying the buffered signal to the ADC further comprises supplying the buffered signal directly to the ADC.

* * * * *

UNITED STATES PATENT AND TRADEMARK OFFICE
CERTIFICATE OF CORRECTION

Page 1 of 1

PATENT NO. : 11,159,133 B2
APPLICATION NO. : 16/717571
DATED : October 26, 2021
INVENTOR(S) : Alfio Zanchi It is certified that error appears in the above-identified patent and that said Letters Patent is hereby corrected as shown below:

In the Specification

Column 5, Line 3, delete "w" and insert therefor -- "ω" --.

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*